United States Patent
Huang et al.

(10) Patent No.: US 10,581,081 B1
(45) Date of Patent: Mar. 3, 2020

(54) COPPER FOIL FOR NEGATIVE ELECTRODE CURRENT COLLECTOR OF LITHIUM ION SECONDARY BATTERY

(71) Applicant: CHANG CHUN PETROCHEMICAL CO., LTD., Taipei (TW)

(72) Inventors: Huei-Fang Huang, Taipei (TW);
Kuei-Sen Cheng, Taipei (TW);
Jui-Chang Chou, Taipei (TW);
Yao-Sheng Lai, Taipei (TW)

(73) Assignee: CHANG CHUN PETROCHEMICAL CO., LTD., Taipei (TW)

( * ) Notice: Subject to any disclaimer, the term of this patent is extended or adjusted under 35 U.S.C. 154(b) by 0 days.

(21) Appl. No.: 16/429,921

(22) Filed: Jun. 3, 2019

Related U.S. Application Data

(60) Provisional application No. 62/800,263, filed on Feb. 1, 2019.

(51) Int. Cl.
| | |
|---|---|
| *H01M 4/66* | (2006.01) |
| *H01M 4/04* | (2006.01) |
| *H01M 10/0525* | (2010.01) |
| *H01M 4/02* | (2006.01) |

(52) U.S. Cl.
CPC ......... *H01M 4/661* (2013.01); *H01M 4/0469* (2013.01); *H01M 10/0525* (2013.01); *H01M 2004/027* (2013.01)

(58) Field of Classification Search
CPC ............... H01M 4/661; H01M 4/0469; H01M 10/0525; H01M 2004/027
See application file for complete search history.

(56) References Cited

U.S. PATENT DOCUMENTS

| | | | |
|---|---|---|---|
| 2004/0029006 A1* | 2/2004 | Otsuka | C25D 1/04 429/220 |
| 2019/0249322 A1* | 8/2019 | Lee | H01M 4/661 |

OTHER PUBLICATIONS

C.-H. Huang, W.-Y. Shu, H.-M. Wu, C.-H. Lee. Pulsed Deposition of Ultra-thin Copper Foils, Plating & Surface Finishing, Sep. 2004, 34-38.*

* cited by examiner

*Primary Examiner* — Carlos Barcena
(74) *Attorney, Agent, or Firm* — Nixon Peabody LLP; Thomas P. Pavelko

(57) ABSTRACT

Electrodeposited copper foils having properties suitable for use as negative electrode current collectors in lithium-ion secondary batteries are disclosed. The copper foil has a yield strength in the range of 11 to 45 $kg/mm^2$, and a difference in residual stress between the drum side and the deposited side of at most 95 MPa. Negative electrode current collectors for lithium-ion secondary battery, a lithium-ion secondary battery incorporating the negative electrode, and batteries containing the negative electrode current collector are also disclosed.

20 Claims, 3 Drawing Sheets

COPPER FOIL FOR NEGATIVE ELECTRODE CURRENT COLLECTOR OF LITHIUM ION SECONDARY BATTERY

CROSS REFERENCE TO RELATED APPLICATIONS

This application claims the benefit under 35 U.S.C. § 119(e) of U.S. Provisional Application No. 62/800,263 filed Feb. 1, 2019, the contents of which are incorporated herein by reference in their entirety.

FIELD OF THE INVENTION

The present disclosure relates to electrodeposited copper foils having high durability and workability. The disclosure also relates to lithium-ion secondary batteries made using said electrodeposited copper foils.

BACKGROUND

Lithium-ion secondary batteries have a combination of high energy and high power density, making it the technology of choice for portable electronic devices, power tools, electric vehicles ("EVs"), energy storage systems ("ESS"), cell phones, tablets, space applications, military applications, and railways, electric vehicles (EVs), include hybrid electric vehicles ("HEVs"), plug-in hybrid electric vehicles ("PHEVs"), and pure battery electric vehicles ("BEVs"). If EVs replace the majority of fossil fuel (e.g., gasoline, diesel fuel, etc.) powered transportation, lithium-ion secondary batteries will significantly reduce greenhouse gas emissions. The high energy efficiency of lithium-ion secondary batteries may also allow their use in various electric grid applications, including improving the quality of energy harvested from wind, solar, geo-thermal and other renewable sources, thus contributing to their more widespread use in building an energy-sustainable economy.

Therefore, lithium-ion secondary batteries are of intense interest for commercial ventures as well as in basic research in government and academic laboratories. Although research and development in this field has abounded in recent years and lithium-ion secondary batteries are currently in use, there remains a need for improvements with respect to higher capacity, higher current generation, and batteries that can undergo more charge/discharge cycles thereby extending their useful life. Additionally, improvements in the weight of the batteries are needed to improve applications in several environments, such as vehicle, portable electronics and space applications.

Lithium-ion secondary batteries typically include a negative electrode current collector of a metal foil on which is deposited a negative electrode active material. Copper foils are often used as the negative electrode current collector because copper is a good conductor of electrical current. As demands for lower weight batteries become ever more urgent, the current collector needs to be thinner to reduce the size and weight of lithium-ion secondary battery. These thinner current collectors are prone to wrinkling, tearing, cracking and other forms of damage. Additionally, to increase the capacity of the lithium-ion secondary battery, materials such as silicon (Si), germanium (Ge), and tin (Sn) are mixed with or fill the higher capacity active material in a battery, exacerbating the expansion and contraction of the active material and stresses on the copper foil it is in contact with. Furthermore, in some recent advancements, in order to increase the capacity of the batteries, the copper foils, worked as electrodes, are folded and wound. If the copper foil cannot withstand the expansion and contraction of the active material during battery use, and folding and winding during production of the battery, the cycle characteristics of the battery are adversely affected.

There therefore remains a need for improved copper foils for use in lithium-ion secondary batteries. This includes a need for thinner copper foils having improved workability and durability and that, when combined with the negative electrode active materials to provide lithium-ion secondary batteries, do not fail under high cycles of charge and discharge due to separation between the copper foil and the electrode active materials, or fail due to the copper foil fracturing. All the while these needed thinner copper foils must fulfill the goals of reducing the weight and increasing the capacity of lithium-ion secondary batteries.

SUMMARY

In general, the inventions described herein relate to a copper foil such as electrodeposited copper foils that can be used as a negative electrode current collector in lithium-ion secondary batteries. Copper foils have been prepared having controlled properties such as a controlled yield strength and a controlled difference between the residual stress on the deposited side and the drum side of the copper foil. The copper foils have excellent workability, low wrinkling and cracking.

In a first aspect, the invention comprises an electrodeposited copper foil comprising a drum side and a deposited side opposing to the drum side. The drum side and the deposited side of the electrodeposited copper foil each possess a residual stress, wherein the difference in residual stress between the drum side and the deposited side of the electrodeposited copper foil has a magnitude of, at most, 95 MPa.

In addition, the yield strength of the electrodeposited copper foil is in the range of 11 $kg/mm^2$ to 45 $kg/mm^2$, such as in the range of about 16 $kg/mm^2$ to about 36 $kg/mm^2$.

Optionally, the difference in residual stress between the drum side and the deposited side of the electrodeposited copper foil is at most 85 MPa, such as at most 81 MPa.

Optionally, the deposited side of the electrodeposited copper foil exhibits a void volume (Vv) value of about 0.15 ($\mu m^3/\mu m^2$) to about 1.30 ($\mu m^3/\mu m^2$), such as about 0.18 ($\mu m^3/\mu m^2$) to about 1.11 ($\mu m^3/\mu m^2$), or about 0.25 ($\mu m^3/\mu m^2$) to about 1.00 ($\mu m^3/\mu m^2$).

Optionally the thickness of the electrodeposited copper foil is from about 3 µm to about 20 µm.

In some options, the residual stress on the deposited side of the electrodeposited copper foil is in the range of −40 MPa to 100 MPa.

In some other options, the residual stress on the drum side of the electrodeposited copper foil is in the range of −47 MPa to 42 MPa.

Optionally, the deposited side of the electrodeposited copper foil exhibits a core void volume (Vvc) value of 0.14 ($\mu^3/\mu m^2$) to 1.15 ($\mu^3/\mu m^2$).

Optionally, the deposited side of the electrodeposited copper foil exhibits a dale void volume (Vvv) value of at most 0.15 ($\mu m^3/\mu m^2$).

In a second aspect, the invention comprises a negative electrode current collector comprising the electrodeposited copper foil according to the first aspect of the invention.

In a third aspect, the invention comprises the negative electrode comprising the negative electrode current collector of the second aspect of the invention, and further comprising a negative electrode active material coated on the negative electrode current collector.

In a fourth aspect, the invention comprises a lithium-ion secondary battery comprising the negative electrode according to the third aspect of the invention.

Optionally said lithium-ion secondary battery exhibits a charge-discharge cycle life of at least 900.

In a fifth aspect, the invention comprises a device comprising the lithium-ion secondary battery according to the fourth aspect of the invention.

The electrodeposited copper foil as described herein shows excellent properties when used in lithium-ion secondary batteries. In addition to allowing the fabrication of light lithium-ion secondary batteries with high capacity, such lithium-ion secondary batteries made of these electrodeposited copper foils have excellent cycling properties. For example, the copper foils do not crack, wrinkle or even break during or prior to charge-discharge cycle testing. Additionally, the electrodeposited foils have excellent adhesion properties to the active materials used in batteries, such as carbon materials.

The above summary is not intended to represent every embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings.

Figure 1:
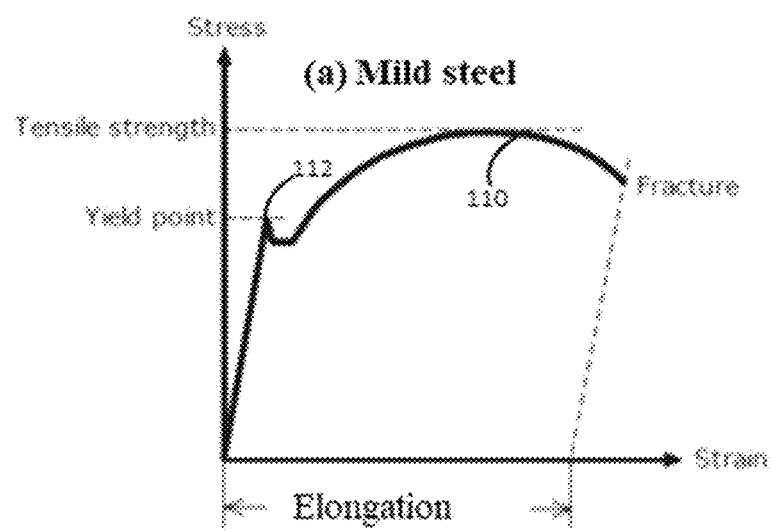
FIG. 1 shows a stress-strain plot for a material such as a mild steel.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

Articles of manufacture herein relate to electrodeposited copper foils that have quantifiable characteristics and which provide good performance when used as current collectors. For example, these electrodeposited copper foils can be combined with active materials to provide anodes for lithium-ion secondary batteries. Some embodiments of the electrodeposited copper foils have a low residual stress difference between the drum side and the deposited side of the electrodeposited copper foil as well as a yield strength that balances the need for strength while avoiding brittleness. Some other embodiments of the electrodeposited copper foil feature volume of voids in the copper foils modulated to specific amounts.

As used herein the "drum side" of the electrodeposited copper foil is the surface of the electrodeposited copper foil that is in contact with a cathode drum used during the electrodeposition, while the "deposited side" is the opposite side to the drum side, or the surface of the electrodeposited copper foil that is in contact with an electrolyte solution during the electrodeposition forming the electrodeposited copper foil. These terms relate to a manufacturing process for producing electrodeposited copper foils which include partially immersing the rotating cathode drum assembly into the electrolyte solution containing copper ions. Therefore, under operation of an electric current, copper ions are drawn to the cathode drum and reduced, resulting in copper metal plating onto the surface of the cathode drum forming an electrodeposited copper foil on the surface of the cathode drum. This electrodeposited copper foil so formed and removed from the cathode drum in a continuous process by rotating the cathode drum and removing the electrodeposited copper foil as the formed copper foil rotates with the cathode drum out of the electrolyte solution. For example, the electrodeposited copper foil can be pulled off the cathode drum as it is formed by, and passed over or through rollers in a continuous process.

As used herein the "residual stress" is the stress present inside an object, component or structure after all external applied forces have been removed. When the residual stress is a compressive stress, the value is denoted with a negative sign ("−") before the value. When the residual stress is a tensile stress, a positive sign ("+") is used before the value.

In some embodiments by minimizing the difference in residual stress of the electrodeposited copper foil between the drum side and the deposited side (ΔRS), the cycle life of a battery incorporating the electrodeposited copper foil is extended. That is, a battery using an electrodeposited copper foil having a larger ΔRS will have a shorter useful lifetime than a battery using an electrodeposited copper foil having a smaller ΔRS. Therefore, in some embodiments, the ΔRS is minimized (e.g., less than about 95 MPa, less than about 85 MPa, less than about 81 MPa, or even about 0 MPa).

If ΔRS of the electrodeposited copper foil is too large, such as greater than 95 MPa, the electrodeposited copper foil can be more easily broken than if the difference in residual stress is kept low, such as less than about 95 MPa. Therefore, the battery performance will be impacted negatively if the ΔRS of the electrodeposited copper foil is too high due to failure of the electrodeposited copper foil due to excessive expansion on contraction during battery cycling. Therefore, if the residual stress of the electrodeposited copper foil is too large, the cycle life of the battery is bad and the electrodeposited copper foil can be easily broken during the cycle life test due to excessive expansion and contraction.

As used herein "yield strength" is a material property defined as the stress at which a material begins to deform plastically. Generally, this is determined by measuring the strain under an imparted stress and analyzing the data, for example by way of a stress-strain plot. Since curves in stress-strain plots can vary widely in shape according to the properties of the material tested, different methods of measuring and identifying the yield strength form stress-strain plots can be used depending on the material.

A stress-strain plot for a material such as a mild steel is shown by FIG. 1. These materials exhibit a characteristic drop in the stress-strain curve 110 at the end of the elastic (or mainly elastic) region. This kind of material therefore illustrates a specific characteristic point 112. The stress at point 112 is known as the "yield point" or "upper yield point".

Figure 2:
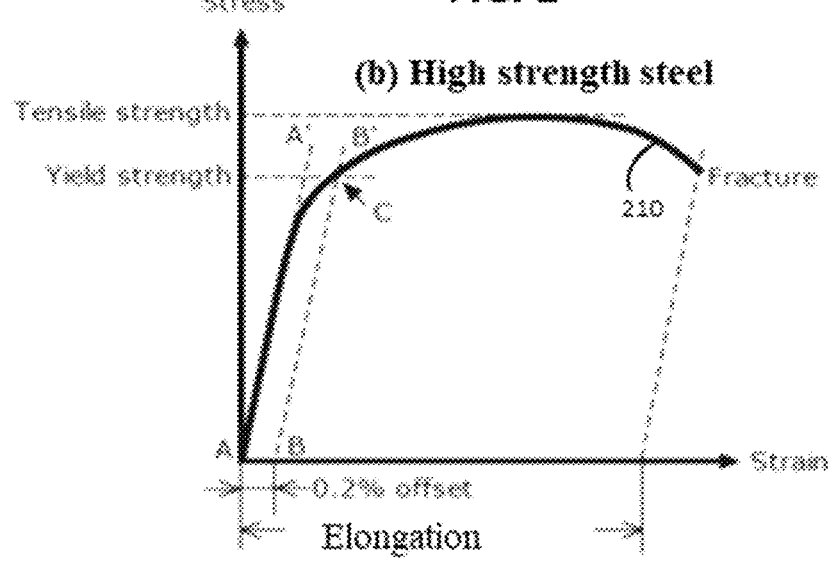
FIG. 2 shows a stress-strain plot for a material such as a high strength steel or stainless steel.

FIG. 2 shows a stress-strain curve for a material such as a high strength steel or stainless steel. These kinds of materials exhibit no specific yield point, and instead produce a smooth curve 210 with a linear initial portion, indicated by tangent line A-A' in the figure. In this case, the stress required to produce an offset amount of 0.2 percent can be used for the standard strength equivalent to the yield point. That is, the yield strength at 0.2% offset, known as the "0.2% offset yield strength", is determined by drawing a straight line B-B' parallel to the tangent line A-A' in the linear section and offset from the tangent line A-A' by 0.2%, reaching the intersection on the x-axis at a strain equal to 0.002 and intersecting the curve 210 at point C. Thus, the 0.2% offset yield strength is the stress read at point C in curve 210.

Figure 3:
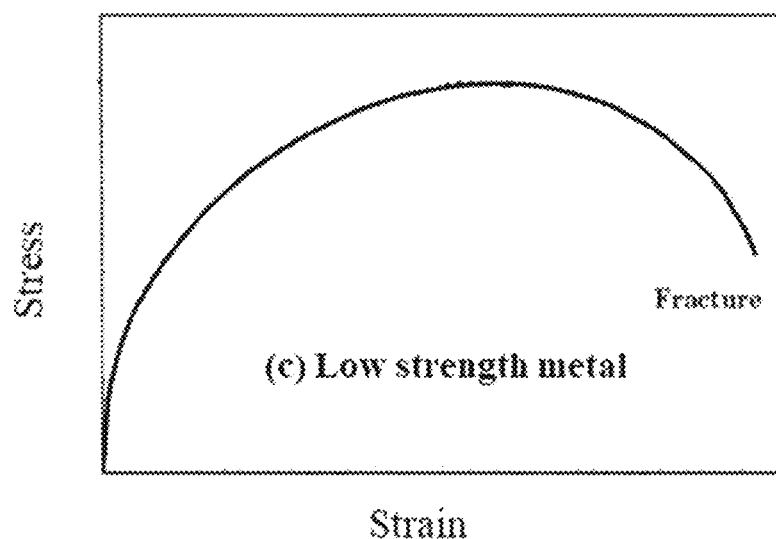
FIG. 3 shows a stress-strain plot for a low strength metal such as thin copper foil.

For some material, for example with low strength metal (such as thin copper foil), the material has a non-linear stress-strain relationship making it difficult to accurately measure the plastic strain. FIG. 3 shows a stress-strain curve of a low strength metal. The featureless smooth curvature depicted in this figure illustrates the difficulty to accurately measure the plastic strain. Namely, the difficulty lies in that there is no yield point, and a 0.2% offset yield strength is difficult to calculate because the curve does not have a well-defined initial linear portion.

Figure 4:
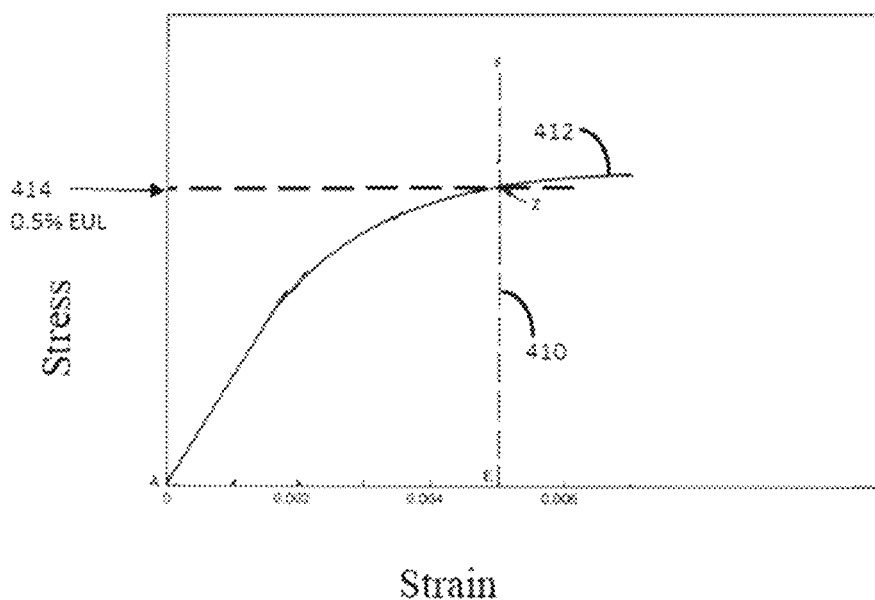
FIG. 4 shows a stress-strain plot illustrating the Extension Under Load method for quantifying yield strength.

Thus, for low strength materials, such as an electrodeposited copper foil, the approach as shown with reference to FIG. 4, can be used. This method requires, on the stress-strain plot, drawing an ordinate line 410 (line E-F), which intersects the curve 412 from a point on the x-axis where the elongation equals the specified extension. The stress value at the intersection of line E-F, point Z, is defined as the "Yield Strength at 0.5% Extension Under Load" or "0.5% EUL" denoted as 414 in the plot. In some embodiments, the yield strength is the Yield Strength at 0.5% EUL.

If the yield strength of an electrodeposited copper foil is too high, such as more than about 45 kg/mm$^2$, the electrodeposited copper foil is brittle (e.g., lower toughness), and will tend to crack and break more easily. For example, where the yield strength is too high, a battery made using the electrodeposited copper foil might fail during cycling due to cracking or breaking. Conversely, where the yield strength of the electrodeposited copper foil is too low, such as less than about 11 kg/mm$^2$, the electrodeposited copper foil will tend to buckle and wrinkle too easily, also providing inferior battery cycling properties.

The yield strength, and residual stress of both the drum side and deposited side, of an electrodeposited copper foil can be modulated by multiple methods. For example, the residual stress of the drum side can be modulated by either mechanical or chemical polishing of the surface of the cathode drum. The yield strength and residual stress on both sides of the electrodeposited copper foil can also be modulated by changing the conditions of electrodeposition, such as modifications in the pulse current plating or pulse reverse current plating method used. The yield strength and the difference of the residual stress of the copper foil can also be adjusted by adding organic additives to the electroplating solution, such as sodium 3-(benzothiazol-2-ylthio)-1-propanesulfonate ("ZPS"), 3-(1-pyridinio)-1-propanesulfonate ("PPS"), aniline-2-sulfonic acid, 5-amino-2-chlorobenzenesulfonic acid, 1,1-dioxo-1,2-benzothiazol-3-one (saccharin), animal glue, gelatin, polyethylene glycol, polypropylene glycol, starch, carboxymethyl cellulose ("CMC"), hydroxyethyl cellulose ("HEC"), polyethylenimine ("PEI"), polyacrylamide and combinations thereof. In some embodiments, the PEI and saccharine concentrations in the electroplating solution can be modulated to control the properties of an electrodeposited copper foil.

Figure 5:
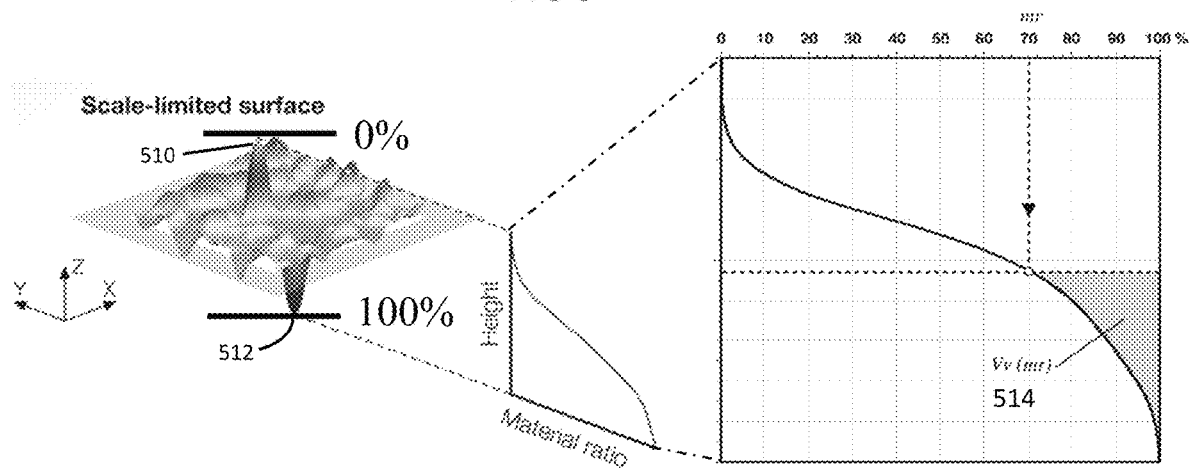
FIG. 5 shows a 3D surface plot and an areal material ratio plot.

FIG. 5 shows a 3D surface and the derivation of the areal material plot for obtaining volume parameters. FIG. 5, left side, is a three-dimensional graphic representation of the surface geometry of a surface, such as a drum side or a deposited side of an electrodeposited copper foil. FIG. 5, right side shows the derivation of an areal material ratio curve as can be obtained by using the ISO Standard Method ISO 25178-2:2012, which spans a material ratio (mr) of 0%, at the top of the highest peak 510, to the lowest valley 512 at which the mr is 100%. The void volume (Vv) is calculated by integrating the volume of the voids enclosed above the surface and below a horizontal cutting plane set at a height corresponding to a specified material ratio (mr) between 0% (the top of the peak 510) and 100% (the bottom of the valley 512). For example, the Vv at 70% mr is shown as the shaded area 514 on the right side plot of FIG. 5.

Figure 6:
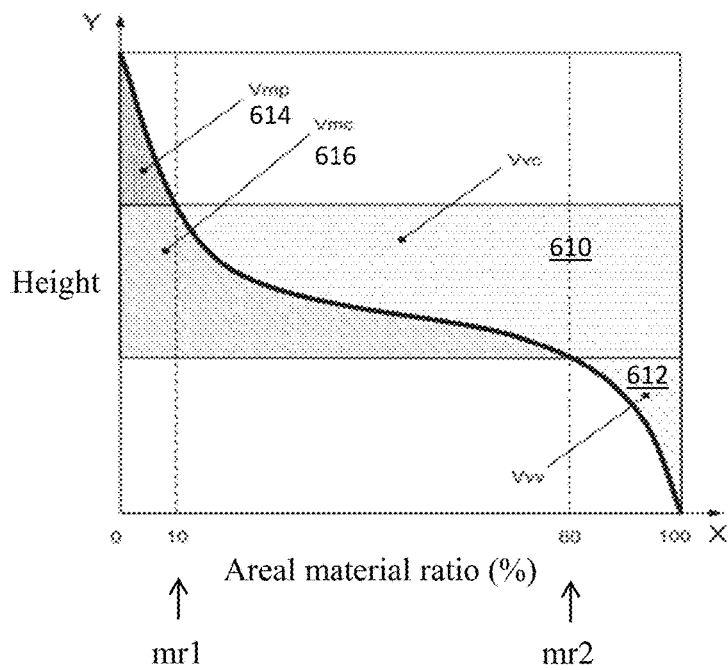
FIG. 6 shows details of an areal material ratio plot.

FIG. 6 shows more details of an areal material ratio plot with some relationship regarding different kinds of volume parameters defined. The core void volume (Vvc) is the difference in void volume between two material ratios, such as mr1 and mr2, shown as area 610. For example, Vvc can be chosen where mr1 is 10% and mr2 is 80%. The dale void volume (Vvv), which is also called valley void volume, is the void volume at a specified mr value, such as mr at 80%, shown as area 612. The void volume (Vv) at mr1 is the sum of the core void volume (Vvc) between mr1 and mr2, area 610, and the dale void volume (Vvv), area 612, at mr2. Other regions include the peak material volume (Vmp), area 614, and the core material volume (Vmc), area 616.

In some embodiments, the electrodeposited copper foil has a Vv, in a controlled range between a low and a high value, such as between a low value of about 0.15 ($\mu m^3/\mu m^2$) and a high value of about 1.30 ($\mu m^3/\mu m^2$). When Vv is too small, such as less than about 0.15 ($\mu m^3/\mu m^2$), the adhesion of the electrodeposited copper foil to the active material is poor due to weak anchor effect. That is, the material cannot anchor to the surface very well so adherence is poor. Conversely, if Vv is too large, such as above about 1.30 ($\mu m^3/\mu m^2$), the active material does not coat uniformly on the surface of the electrodeposited copper foil. That is, a large Vv corresponds to large voids on the surface of the electrodeposited copper foil and the active material cannot effectively fill all of these voids, leaving some uncovered and covered voids that remain between the electrodeposited copper foil and the active material layer. Consequently, both in the too low region and too high region, the adhesion of the active material to the electrodeposited copper foil is poor, and batteries made with aforesaid electrodeposited copper foils not having Vv in the controlled range exhibit poor battery characteristics.

A Vv value in the range of 0.15 to 1.30 ($\mu m^3/\mu m^2$) are described for the deposited side and drum side of the electrodeposited copper foil, and which are independently selected between the deposited side and drum side. It is to be expressly understood that these ranges are continuous and could be represented as: 0.15, 0.16, 0.17, 0.18, 0.19, 0.20, 0.21, 0.22, 0.23, 0.24, 0.25, 0.26, 0.27. 0.28, 0.29, 0.30, 0.21, 0.22, 0.23, 0.24, 0.25, 0.26, 0.27. 0.28, 0.29, 0.30, 0.31, 0.32, 0.33, 0.34, 0.35, 0.36, 0.37. 0.38, 0.39, 0.40, 0.41, 0.42, 0.43, 0.44, 0.45, 0.46, 0.47. 0.48, 0.49, 0.50, 0.51, 0.52, 0.53, 0.54, 0.55, 0.56, 0.57. 0.58, 0.59, 0.60, 0.61, 0.62, 0.63, 0.64, 0.65, 0.66, 0.67. 0.68, 0.69, 0.70, 0.71, 0.72, 0.73, 0.74, 0.75, 0.76, 0.77. 0.78, 0.79, 0.80, 0.81, 0.82, 0.83, 0.84, 0.85, 0.86, 0.87. 0.88, 0.89, 0.90, 0.91, 0.92, 0.93, 0.94, 0.95, 0.96, 0.97. 0.98, 0.99, 1.01, 1.02, 1.03, 1.04, 1.05, 1.06, 1.07, 1.08, 1.09, 1.10, 1.11, 1.12, 1.13, 1.14, 1.15, 1.16, 1.17, 1.18, 1.19, 1.20, 1.21, 1.22, 1.23, 1.24, 1.25, 1.26, 1.27, 1.28, 1.29 or 1.30 ($\mu m^3/\mu m^2$), with each of these values representing an endpoint in a range of values. In some embodiments, the ranges of Vv on the deposited side lie within the range 0.18 to 1.11 ($\mu m^3/\mu m^2$). In some other embodiments, the ranges of Vv on the deposited side lie within the range of values between 0.25 to 1.00 ($\mu m^3/\mu m^2$).

In some embodiments, core void values (Vvc) on the deposited side of the electrodeposited copper foil lie in the range of 0.14 to 1.15 ($\mu m^3/\mu m^2$).

In some embodiments, the electrodeposited copper foil exhibits a dale void volume (Vvv) value on the deposited side of at most 0.15 ($\mu m^3/\mu m^2$).

In some embodiments, core void values (Vvc) on the drum side of the electrodeposited copper foil lie in the range of 0.14 to 1.15 ($\mu m^3/\mu m^2$).

In some embodiments, the electrodeposited copper foil exhibits a dale void volume (Vvv) value on the drum side of at most 0.15 ($\mu m^3/\mu m^2$).

As used herein "anti-tarnish coating" is a coating applied to a metal that can protect the coated metal from degradation such as due to corrosion. In some embodiments, the electrodeposited copper foil includes an anti-tarnish coating formed on the surface of the electrodeposited copper foil. This can be made by any known method and includes dipping or passing the formed electrodeposited sheet through a solution containing anti-tarnish forming additives. For example, a bath including any one or more of zinc (Zn), chromium (Cr), nickel (Ni), cobalt (Co), molybdenum (Mo), vanadium (V) and combinations thereof; or an organic compound such as an azole compound that forms an anti-tarnish layer. The processing can be continuous and part of the overall process in preparing the electrodeposited copper foil.

Charge-discharge testing refers to testing where a potential is applied across the positive and negative electrodes of a battery so as to charge the battery, and then connecting the positive and negative electrodes across a load and allowing a current to pass through the load to discharge the battery. This charge and discharge represents one charge-discharge cycle. The testing can be done to simulate how well a battery performs with respect to repeated use (e.g., charging and discharging repeatedly) and correlates to useful life. The "cycle-life" or "charge-discharge cycle life" is defined as the number of charge-discharge cycles a battery can perform before its nominal capacity falls below 80% of its initial rated capacity.

In some embodiments, the electrodeposited copper foils can be used as current collectors for batteries (e.g., lithium-ion secondary batteries) and are used in a device. As used herein a device comprises any item or component requiring electric power for its operation. For example, self-contained, isolated and mobile components and devices requiring small and light batteries. Without limitation, these can include vehicles (automobiles, street cars, buses, trucks, boats, submarines, airplanes), computers (e.g., for microcontrollers, laptops, tablets), phones (e.g., smart phones, wireless landlines), personal health monitoring and sustaining equipment (e.g., glucose monitors, pacemakers), tools (e.g., electric drills, electric saws), illuminators (e.g., flashlights, emergency lighting, signs), hand held measuring devices (e.g., pH meters, air monitoring devices) and habitation units (e.g., in a spaceship, in a trailer, in a house, in a plane, in a submarine).

EXAMPLES

1. Electrodeposited Copper Foil Preparation

Copper wire was dissolved in an aqueous solution of sulfuric acid (50 wt %) to prepare a copper sulfate electrolyte solution which contained 320 g/L of copper sulfate ($CuSO_4.5H_2O$) and 80 g/L of sulfuric acid. Hydrochloric acid (obtained from RCI Labscan Ltd) was added to provide a chloride ion concentration of 30 mg/L in the copper sulfate electrolyte solution. Additional components including 4.0 mg to 14.5 mg of PEI (polyethylenimine, linear, Mn=5000, available from Sigma-Aldrich Company) and 2.3 mg to 8.3 mg of saccharin (1,1-dioxo-1,2-benzothiazol-3-one, available from Sigma-Aldrich Company) are added in each liter of the copper sulfate electrolyte solution for providing several different electrolyte solutions.

The system for manufacturing the electrodeposited copper foil includes a metal cathode drum and an insoluble metal anode. The metal cathode drum is rotatable and has a polished surface. In this system, the insoluble metal anode is arranged at approximately the lower half of the metal cathode drum and surrounds the metal cathode drum. The electrodeposited copper foil is manufactured using continuous electrodeposition by flowing the copper sulfate electrolyte solution between the metal cathode drum and the insoluble metal anode, applying an electrical current between these to allow copper ions to be drawn to the metal cathode drum and reduced causing electrodeposited copper on the metal cathode drum forming the electrodeposited copper foil, and detaching the electrodeposited copper foil from the metal cathode drum when a predetermined thickness is obtained. The depositing conditions of the liquid temperature of the copper sulfate electrolyte solution was about 45° C., and the current density was about 40 A/dm². Electrodeposited copper foils having a thickness of about 6 µm were prepared.

After the electrodeposited copper foil was produced, the surfaces of the electrodeposited copper foil were treated with an anti-tarnish material, such as in a chromium plating bath, in a continuous fashion by guide rollers passing the electrodeposited copper foil through a plating bath. The anti-tarnish treatment is conducted in the plating bath containing 1.5 g of $CrO_3$ per liter (obtained from Sigma-Aldrich) at the liquid temperature of 25° C. and the current density of about 0.5 A/dm² for 2 seconds.

The electrodeposited foil was passed through an air knife to remove any excess coating and to dry the electrodeposited copper foil prior to being wound into a roll at the end of the process. The roll can then be stored and then passed on for further processing such as for use in making lithium-ion secondary batteries.

2. Laminated Lithium-Ion Secondary Battery

Laminated type lithium-ion secondary batteries were prepared as follows and subjected to high c-rate charging/discharging testing.

A cathode slurry and an anode slurry were made using N-methyl-2-pyrrolidone (NMP) as solvent. The cathode slurry was formulated to have a liquid to solid ratio of 195 wt % (195 g of NMP:100 g of the cathode active material). The anode slurry was made to have a liquid to solid ratio of 60 wt % (60 g of NMP:100 g of the anode active material). Formulations of the cathode active material and the anode active material are shown in Table 1.

TABLE 1

Cathode Active Material and Anode Active Material Formulations

| | |
|---|---|
| Cathode active material formulation: Based on the total weight of the cathode active material | |
| Cathode active substance (LiCoO$_2$) | 89 wt % |
| Conductive additive (Flaked graphite; KS6) | 5 wt % |
| Conductive additive (Conductive carbon powder; Super P ®) | 1 wt % |
| Solvent-Based Binder (PVDF1300) | 5 wt % |
| Anode active material formulation: Based on the total weight of the anode active material | |
| Anode active substance: Mesophase Graphite Powder (MGPA) | 93.9 wt % |
| Conductive additive (Conductive carbon powder; Super P ®) | 1 wt % |
| Solvent-Based Binder (PVDF6020) | 5 wt % |
| Oxalic acid | 0.1 wt % |

The cathode slurry was coated on an aluminum foil, and the anode slurry was coated on the electrodeposited copper foil. After the solvent evaporated, the anode and cathode were pressed and cut into the desired dimensions. The cathodes and anodes are alternately stacked with separators (Celgard Company) sandwiched there between, and placed in a container molded by laminate film. The container was filled with an electrolyte, and sealed to form a battery. The size of the laminated type battery was 41 mm×34 mm×53 mm.

For high c-rate charging and discharging testing (e.g., charge-discharge testing), the charging mode was a constant current-constant voltage (CCCV) mode, where the charging voltage was 4.2V, and the charging current was 5 C. The discharging mode was the constant current (CC) mode, the discharging voltage was 2.8 V, and the discharging current was 5 C. The charging-discharging test on the batteries was conducted at high temperature (at 55° C.).

Table 2 shows data from a designed experiment exemplifying some embodiments of an electrodeposited copper foil. The electrochemical copper foil properties of yield strength, Vvc, Vvv, Vv and residual stress are tabulated. The properties of charge-discharge cycle life on a laminated type battery made using the electrodeposited copper foil are also tabulated. The table shows in columns from left to right five Experiments (E.1 to E.5), and four control experiments (C.1 to C.4). The Experiments E.1 through E.5 show excellent battery performance as shown by the charge-discharge cycling (between about 900 and 1200) as compared to the control experiments C.1 through C.4 (less than about 900). Examination of the data shows that the high cycling numbers obtained in E.1 through E.5 are associated with the electrodeposited copper foils having yield strength in the range of 11 kg/mm$^2$ to 45 kg/mm$^2$ and the ΔRS between the deposited side and the drum sideless than 95 MPa. The comparative experiments C.1 through C.4 have one or both of the yield strength and the ΔRS out of the range tabulated for E.1 to E.5.

Table 2 also illustrates the effect of void volumes. In addition, the data shows the effect of void volume. For example, where the Vvc on the deposited side is too low, such as below about 0.14 (C.1 and C.2) or too high, such as above about 1.15 (C.3 and C.4), the performance of the battery is not as good as for where the Vvc is between these values on the deposited side (e.g., between 0.08 and 1.27 for E.1-E.5).

When Vvv is high on the deposited side, such as above about 0.15 (C.3 and C.4), the battery performance is also not as good as when the Vvv is low on the deposited side, such as below about 0.15 (E.1-E.5).

When Vv is too low on the deposited side, such as less than about 0.15 (C.1 and C.2) or too high on the deposited side, such as above about 1.3 (C.3 and C.4), the battery performance poor, as compared to when Vv is between the values identified in the controls, such as between about 0.09 and 1.48, where the battery performance is good (E.1-E.5).

TABLE 2

| | | E.1 | E.2 | E.3 | E.4 | E.5 | C.1 | C.2 | C.3 | C.4 |
|---|---|---|---|---|---|---|---|---|---|---|
| PEI (ppm) | | 13 | 9.5 | 9.5 | 9.5 | 6.0 | 14.5 | 9.5 | 9.5 | 4.0 |
| Saccharin (ppm) | | 5.3 | 5.3 | 6.8 | 3.8 | 5.3 | 5.3 | 8.3 | 2.3 | 5.3 |
| Yield Strength (kg/mm$^2$) | | 44.0 | 11.8 | 35.6 | 20.6 | 16.4 | 46.9 | 50.4 | 20.2 | 9.9 |
| Vvc | Deposited side | 0.16 | 0.68 | 0.21 | 0.98 | 1.07 | 0.06 | 0.08 | 1.31 | 1.27 |
| (μm$^3$/μm$^2$) | Drum side | 0.59 | 0.6 | 0.59 | 0.58 | 0.59 | 0.60 | 0.60 | 0.58 | 0.59 |
| Vvv | Deposited side | 0.01 | 0.10 | 0.10 | 0.05 | 0.04 | 0.01 | 0.01 | 0.34 | 0.21 |
| (μm$^3$/μm$^2$) | Drum side | 0.03 | 0.02 | 0.03 | 0.04 | 0.03 | 0.03 | 0.02 | 0.04 | 0.04 |
| Vv | Deposited side | 0.17 | 0.78 | 0.31 | 1.03 | 1.11 | 0.07 | 0.09 | 1.65 | 1.48 |
| (μm$^3$/μm$^2$) | Drum side | 0.62 | 0.62 | 0.62 | 0.62 | 0.62 | 0.63 | 0.62 | 0.62 | 0.63 |
| Residual Stress | Deposited side | 98.9 | 54.4 | 82.5 | 80.5 | −39.4 | 102.5 | 86.2 | 66.8 | 1.8 |
| (MPa) | Drum side | 6.0 | −5.2 | 41.8 | −10.2 | −46.8 | −3.2 | 38.0 | −36.1 | −10.6 |
| | Difference | 92.8 | 59.6 | 40.7 | 90.7 | 7.4 | 105.7 | 48.2 | 102.9 | 12.4 |
| Charge-Discharge Cycle Test | | 926 | 997 | 1114 | 902 | 1224 | 815 | 803 | 658 | 681 |

4. Test Methods

Yield Strength (0.5% EUL)

The yield strength values in Table 2 were obtained from the examples and comparative examples via the method of IPC-TM-650 2.4.18. The electrodeposited copper foil for each example and comparative example was cut to obtain a test sample with a size of 100 mm×12.7 mm (length×width), and the test sample was measured at room temperature (about 25° C.) under the conditions of a chuck distance of 50 mm and a crosshead speed of 50 mm/min using Model AG-I testing machine manufactured by Shimadzu Corporation. Recording of measurements commenced after the applied force exceeded 0.075 kg. The yield strength (0.5% EUL) was obtained by drawing a straight line parallel to the Y axis (stress) at a point where the strain is 0.5%(ε=0.005) in a curve of the relationship between strain and stress similar to as previously described with reference to FIG. 4.

Residual Stress

The residual stress values in Table 2 were obtained from the examples and comparative examples by using an X-ray Empyrean system manufactured by Panalytical as the measuring apparatus. The X-ray tube was Cu (wavelength=1.54184 Å), the tube voltage was 45 kV, and the tube current was 20 mA. The examples and comparative examples were measured on the Empyrean system with one grazing incidence angle using an X-ray Hybrid mirror in the incident beam, a 0.27 parallel plate collimator, and a proportional detector in the diffracted beam.

Volume Parameters

The void volume (Vv) values in Table 2 were obtained from the examples and comparative examples by a procedure in accordance with ISO 25178-2 (2012). Surface texture analysis was performed of images of a laser microscope. The laser microscope was a LEXT OLS5000-SAF manufactured by Olympus and the images were made at an air temperature of 24±3° C. and a relative humidity of 63±3%. The filter setting was set to unfiltered. The light source was a 405 nm-wavelength source. The objective lenses were 100× magnification (MPLAPON-100×LEXT). The optical zoom was set to 1.0×. The image area was set to 129 μm×129 μm. The resolution was set to 1024 pixels×1024 pixels. The condition was set to auto tilt removal.

The Vvc was calculated with the material ratios of p and q where p is 10% and q is 80%, and Vvv was calculated with a material ratio of 80%. The unit of the void volume is $\mu m^3/\mu m^2$.

As used herein the term "comprising" or "comprises" is used in reference to compositions, methods, and respective component(s) thereof, that are essential to the claimed invention, yet open to the inclusion of unspecified elements, whether essential or not.

As used in this specification and the appended claims, the singular forms "a," "an," and "the" include plural references unless the context clearly dictates otherwise. Thus for example, references to "the method" includes one or more methods, and/or steps of the type described herein and/or which will become apparent to those persons skilled in the art upon reading this disclosure and so forth. Similarly, the word "or" is intended to include "and" unless the context clearly indicates otherwise.

Other than in the operating examples, or where otherwise indicated, all numbers expressing quantities of ingredients or reaction conditions used herein should be understood as modified in all instances by the term "about". The term "about" when may mean±5% (e.g., ±4%, ±3%, ±2%, ±1%) of the value being referred to.

Where a range of values is provided, each numerical value between and including the upper and lower limits of the range is contemplated as disclosed herein.

Unless otherwise defined herein, scientific and technical terms used in connection with the present application shall have the meanings that are commonly understood by those of ordinary skill in the art. Further, unless otherwise required by context, singular terms shall include pluralities and plural terms shall include the singular.

It should be understood that this invention is not limited to the particular methodology, protocols, and reagents, etc., described herein and as such may vary. The terminology used herein is for the purpose of describing particular embodiments only, and is not intended to limit the scope of the present invention, which is defined solely by the claims.

Any patents, patent applications, and publications including ASTM, JIS methods identified that are disclosed herein are expressly incorporated herein by reference for the purpose of describing and disclosing, for example, the methodologies described in such publications that can be used in connection with the present invention. These publications are provided solely for their disclosure prior to the filing date of the present application. Nothing in this regard should be construed as an admission that the inventors are not entitled to antedate such disclosure by virtue of prior invention or for any other reason. All statements as to the date or representation as to the contents of these documents is based on the information available to the applicants and does not constitute any admission as to the correctness of the dates or contents of these documents.

We claim:

1. An electrodeposited copper foil comprising:
   a drum side; and
   a deposited side opposing to the drum side;
   wherein the drum side and the deposited side each possess a residual stress, wherein a difference in residual stress between the drum side and the deposited side of the electrodeposited copper foil has a magnitude in the range of 7.4 to 95 MPa; and
   wherein a yield strength of the electrodeposited copper foil is in the range of 11 kg/mm$^2$ to 45 kg/mm$^2$.

2. The electrodeposited copper foil of claim 1, wherein the yield strength of the electrodeposited copper foil is in the range of 16 kg/mm$^2$ to 36 kg/mm$^2$.

3. The electrodeposited copper foil of claim 1, wherein the difference in residual stress between the drum side and the deposited side of the electrodeposited copper foil is in the range of 7.4 to 85 MPa.

4. The electrodeposited copper foil of claim 1, wherein the difference in residual stress between the drum side and the deposited side of the electrodeposited copper foil is in the range of 7.4 to 81 MPa.

5. The electrodeposited copper foil of claim 1, wherein the residual stress on the deposited side of the electrodeposited copper foil is in the range of −40 MPa to 100 MPa.

6. The electrodeposited copper foil of claim 1, wherein the residual stress on the drum side of the electrodeposited copper foil is in the range of −47 MPa to 42 MPa.

7. The electrodeposited copper foil of claim 1, wherein the thickness of the electrodeposited copper foil is from 3 μm to 20 μm.

8. An electrodeposited copper foil comprising:
   a drum side; and a deposited side opposing to the drum side;
   wherein the drum side and the deposited side each possess a residual stress, wherein a difference in residual stress between the drum side and the deposited side of the electrodeposited copper foil has a magnitude of at most 95 MPa; and
   wherein a yield strength of the electrodeposited copper foil is in the range of 11 kg/mm$^2$ to 45 kg/mm$^2$, wherein the deposited side of the electrodeposited copper foil exhibits a void volume (Vv) value of 0.15 ($\mu m^3/\mu m^2$) to 1.30 ($\mu m^3/\mu m^2$).

9. The electrodeposited copper foil of claim 8, wherein the deposited side of the electrodeposited copper foil exhibits a void volume (Vv) value of 0.18 ($\mu m^3/\mu m^2$) to 1.11 ($\mu m^3/\mu m^2$).

10. The electrodeposited copper foil of claim 8, wherein the deposited side of the electrodeposited copper foil exhibits a void volume (Vv) value of 0.25 ($\mu m^3/\mu m^2$) to 1.00 ($\mu m^3/\mu m^2$).

11. The electrodeposited copper foil of claim 8, wherein the deposited side of the electrodeposited copper foil exhibits a core void volume (Vvc) value of 0.14 ($\mu m^3/\mu m^2$) to 1.15 ($\mu m^3/\mu m^2$).

12. The electrodeposited copper foil of claim 11, wherein the drum side of the electrodeposited copper foil exhibits a core void volume (Vvc) value of 0.14 ($\mu m^3/\mu m^2$) to 1.15 ($\mu m^3/\mu m^2$).

13. The electrodeposited copper foil of claim 8, wherein the deposited side of the electrodeposited copper foil exhibits a dale void volume (Vvv) value of at most 0.15 ($\mu m^3/\mu m^2$).

14. The electrodeposited copper foil of claim 13, wherein the drum side of the electrodeposited copper foil exhibits a dale void volume (Vvv) value of at most 0.15 ($\mu m^3/\mu m^2$).

15. The electrodeposited copper foil of claim 8, wherein the drum side of the electrodeposited copper foil exhibits a void volume (Vv) value of 0.15 ($\mu m^3/\mu m^2$) to 1.30 ($\mu m^3/\mu m^2$).

16. A negative electrode current collector comprising the electrodeposited copper foil of claim 1.

17. A negative electrode comprising the negative electrode current collector of claim 16, and further comprising a negative electrode active material coated on the negative electrode current collector.

18. A lithium-ion secondary battery comprising the negative electrode of claim 17.

19. The lithium-ion secondary battery of claim 18 exhibiting a charge-discharge cycle life of at least 900.

20. A device comprising the lithium-ion secondary battery of claim 19.

* * * * *